United States Patent [19]
Heming et al.

[11] Patent Number: 6,025,013
[45] Date of Patent: Feb. 15, 2000

[54] PICVD PROCESS AND DEVICE FOR THE COATING OF CURVED SUBSTRATES

[75] Inventors: Martin Heming, Stromberg; Ulrich Lange, Bingen; Roland Langfeld, Frankfurt; Wolfgang Mohl, Worms; Jurgen Otto; Volker Paquet, both of Mainz; Johannes Segner, Stromberg; Martin Walther, Bubenheim, all of Germany

[73] Assignee: Schott Glaswerke, Germany

[21] Appl. No.: 08/716,453

[22] PCT Filed: Mar. 29, 1995

[86] PCT No.: PCT/EP95/01168

§ 371 Date: Jan. 22, 1997

§ 102(e) Date: Jan. 22, 1997

[87] PCT Pub. No.: WO95/26427

PCT Pub. Date: Oct. 5, 1995

[30] Foreign Application Priority Data

Mar. 29, 1994 [DE] Germany .............................. 44 10 841

[51] Int. Cl.[7] .................................................... H05H 1/00
[52] U.S. Cl. .............................. 427/9; 427/569; 427/575; 427/164; 427/166; 427/167; 427/162; 427/579
[58] Field of Search ............................ 427/8, 9, 10, 523, 427/569, 579, 575, 164, 162, 166, 167; 204/298.32

[56] References Cited

U.S. PATENT DOCUMENTS

| | | | |
|---|---|---|---|
| 4,481,229 | 11/1984 | Suzuki et al. | 427/571 |
| 4,500,563 | 2/1985 | Ellenberger | 427/38 |
| 4,935,661 | 6/1990 | Heinecke et al. | 313/231.31 |

(List continued on next page.)

FOREIGN PATENT DOCUMENTS

| | | | |
|---|---|---|---|
| 33 22 680 | 5/1984 | Germany | H01L 21/203 |
| 24 01 86 | 4/1986 | Germany | C23C 16/50 |
| 3413019 A1 | 10/1986 | Germany . | |
| 3931713 C1 | 3/1991 | Germany . | |
| 2 677 841-A1 | 12/1991 | Germany . | |
| 0 502 385 A1 | 2/1992 | Germany . | |
| 41 42 877 A1 | 2/1992 | Germany . | |
| 41 37 606 | 7/1992 | Germany | C23C 16/40 |
| 0 550 058 A2 | 12/1992 | Germany . | |

OTHER PUBLICATIONS

Patent Abstracts of Japan Pub. No. JP4293235 vol. 17, No. 110 (E–1329) pub. date Oct. 16, 1992.

Klug, W., Schneider, R., and Zoller, A. "Plasma Enhanced CVD Hard Coatings for Ophtalmic Optics." 1990, No month.

Heming, M., Hochhaus, R., Otto, J., and Segner, J. "Plasma Impluse Chemical Vapour Deposition—A Novel Technique for Optical Coatings". Tuscon 1992, No month.

*Primary Examiner*—Marianne Padgett
*Attorney, Agent, or Firm*—Kilpatrick Stockton LLP

[57] ABSTRACT

A PCVD process for producing coating layers of uniform thickness of domed substrates. The substrate surface to be coated is arranged in relation to the gas passage surface of a gas showerhead. In order to determine the appropriate processing parameters, in a first series of tests for one type of substrate to be coated, the size of the gas passage surfaces and the gas mass flows through the gas passage surfaces are kept constant, while the intervals between plasma impulses are gradually modified, from an initial value $t_A$ until an optimum value $t_{eff}$ is determined, and until the uniformity of the thickness profile of the layers generated on the substrate may no longer be improved. If required, during a second series of tests, the value $t_{eff}$ may be kept constant, while the thickness profile of the layers is further modified by further optimizing the local parameters and/or the gas mass flows until layer uniformity may no longer be improved. The device includes a gas showerhead subdivided into zones and having gas passage surfaces arranged depending on the substrate being coated. The zones are connected by supply lines to a source of non film-forming gas and to a gas source that supplies fresh gas.

20 Claims, 15 Drawing Sheets

U.S. PATENT DOCUMENTS

| | | | |
|---|---|---|---|
| 4,962,727 | 10/1990 | Harada | 427/569 |
| 4,973,883 | 11/1990 | Hirose | 315/111.41 |
| 4,981,722 | 1/1991 | Möller et al. | 427/569 |
| 5,154,943 | 10/1992 | Etzkorn et al. | 427/569 |
| 5,180,436 | 1/1993 | Ueda et al. | 427/571 |
| 5,192,717 | 3/1993 | Kawakami et al. | 427/571 |
| 5,227,202 | 7/1993 | Thieband et al. | 427/569 |
| 5,236,636 | 8/1993 | Tisack | 427/569 |
| 5,272,360 | 12/1993 | Todoroki et al. | 257/60 |
| 5,449,880 | 9/1995 | Takaki | 427/575 |
| 5,455,061 | 10/1995 | Matossian et al. | 427/10 |

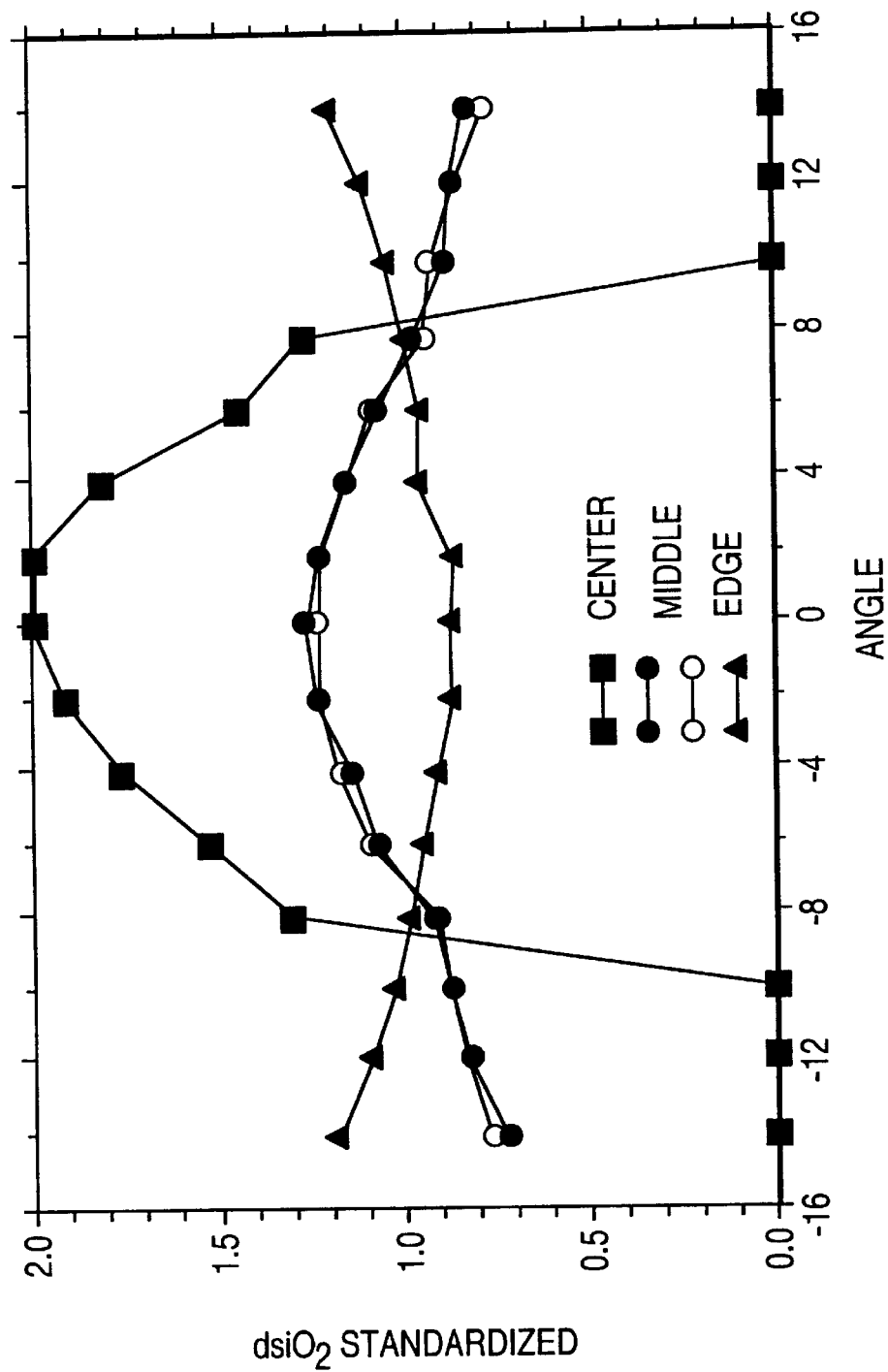

PICVD PROCESS AND DEVICE FOR THE COATING OF CURVED SUBSTRATES

FIELD OF THE INVENTION

The present invention relates to a procedure for determining the process parameters for a plasma impulse chemical vapor deposition (PICVD) process for the production of coatings with a uniform thickness of layers on curved substrates, especially on lenses made of glass or plastics where the substrate surface to be coated is situated opposite the gas emitting surface of a gas showerhead, through which gas mixtures containing the gas forms the coating stream into a reaction chamber where separate plasma impulses are generated through timed impulse pauses.

BACKGROUND

From DE 40 08 405 C1, a microwave PICVD process for the production of a cold light reflector on the interior side of dome shaped substrates is known, which may also consist of plastics. In order to achieve a uniform thickness of coatings, a gas showerhead adapted to the contour of the surface is suggested, among other things. The known process only generally hints at how a curved substrate could be coated uniformly. If a substrate with different surface curvature should be coated—there are more than 10,000 different examples—then this process is not useful for economic reasons because of the multitude of different gas showerheads.

FR 26 77 841 describes a microwave plasma chemical vapor deposition (CVD) reactor for the production of safety and filter coatings on optical plastics substrates, such as lenses. The substrate lies on the electrode of a 13.56 MHz generator with a bias voltage. Oxygen is stimulated by a 2.45 gigahertz microwave field, which in turn stimulates the reaction partner, which is supplied at a remote location and contains silicium. As a consequence, a coating is formed on the substrate. The back side of the substrate is protected from undesired coating by an antibody, which is adapted to the form, and as a result, this process is unecomonical with substrates with different surface curvatures because of the multitude of required antibodies. FR 26 77 841 does not disclose how to attain uniformity with this approach.

DE 41 42 877 A1 describes a CVD process and a device for the coating of semiconductor wafers with uniform thickness. Uniformity is achieved by using a gas showerhead that has several individual gas blow areas. The gas showerhead is situated opposite the substrate and covered by a closed hood, which distributes the coating gas to the substrate rotationally symmetrically. The first and second gas blower area must be on a common level to ensure that a coating of high quality and uniform density can be formed, and it is therefore unlikely that this process can be used for the uniform coating of curved surfaces. A second disadvantage of this approach is the relative slowness of the coating process. Only a low uniformity of ±5% can be achieved, which is insufficient for the production of antireflection coatings. No suggestion concerning the coating of curved substrates with or without use of rotation symmetry is provided, and no measures are mentioned regarding how the backside of such substrates could be protected from the coating process.

DE 39 31 713 C1 describes a process and a device for simultaneous CVD coating from all sides of curved substrates in a 13.56 Megahertz Plasma. According to DE 39 31 713 C1, no difference can be detected in the thickness of the coating from the center to the periphery using this process. However, no measurement accuracy is provided. The process only refers to the precipitation of scratch resistant layers for which requirements for uniformity are much lower than for precipitation of anti-reflection reflection layers. The adaptability of this process for the production of anti-reflection coatings is neither disclosed nor suggested by this reference.

DE 34 13 019 A1 describes a plasma CVD process for the production of a scratch resistant layer to transparent plastics elements through polymerization of hexamethyldisiloxane (HMDSO) or other organic compounds containing silicium, whereby good adhesion with superior surface hardness are achieved through a continuous transition from an organic polymer to an inorganic hard protective coating. The device includes a vacuum recipient and a drum that rotates about its axis, and the plastic parts to be coated are placed at the circumference surface. The parts to be coated pass a coating unit consisting of many single nozzles, through which reaction gases are supplied. A glow discharge is activated via high voltage from outside to the monomeric steam. The production of a scratch resistant layer is possible using this process.

Klug, Schneider and Zöller describe in SPIE Vol. 1323 Optical Thin-Films III: New Developments 1990 (Page 88ff) describes a process for depositing hard and thick (2.5 to 5 $\mu$m) safety coatings to CR-39 lenses through a plasma CVD process with gases from oxygen and silicium compounds. Also described is the production of a blooming coat via high-vacuum vaporization in another coating process. It is suggested not only to produce the scratch resistant layer, but also the anti-reflection coating using the PCVD process. No solution, however, is given as to how the necessary coating uniformity can be achieved with curved substrates using the same process for both coatings. In particular, the problem of the backside coating is not addressed.

U.S. Pat. No. 4,927,704 to Reed et al. also describes a plasma CVD process for the deposit of a transparent scratch resistant layer on plastics, especially polycarbonate, using two transitory coatings, one of which includes a continuous material transition from organic to inorganic. The adjustment of the thickness of the coating occurs using the parameters of mass flow of the coating gases, substrate temperature, excitation frequency, and pressure. The desired thickness of the coating can only be adjusted to ±5%, and the process is therefore too inexact for the production of anti-reflection coatings.

EP 0 502 385 describes a process for the production of double sided coatings of optical tools. Coating of the tools occurs with the help of evaporation sources which are situated at a certain distance opposite the tool support. For the production of uniform coatings, the tool support with the substrates is rotated during the coating process. The rotation of the tool support guarantees that the plasma discharge, which occurs before and after evaporation and which is formed between the electrodes and the tool support, which acts as a counter-electrode, covers the tools in a uniform manner. No detailed description is provided regarding the quality of the coatings or their thickness. One disadvantage of the described process is that a part of the electrode is also coated during the exposure of the evaporation source. A portion of the coating material sprayed on the electrode will therefore be lost in the tool support. The plasma CVD process can obviously only be used in the production of scratch proof layers, as an evaporation process must be utilized for the deposit of the abrasion-resistant (AR) coating, and this process cannot coat both surfaces simultaneously. In addition, this approach is not economical because two coating processes are used and because the high vacuum process is especially uneconomical.

EP 0 550 058 A2 describes a gas zone showerhead for the even coating of tools, such as semiconductor wafers. The individual zones of the gas showerhead can be deposited with different mass flows and different gases. No detailed description is provided concerning curved substrates.

U.S. Pat. No. 4,991,542 to Kohmura et al. describes a process for the simultaneous coating of both sides of even substrates using a plasma CVD process. The substrate to be coated is situated in a reaction chamber. A gas showerhead is provided opposite the sides to be coated, and the showerhead occurs via use of feed-gas supplying electrodes. High frequency voltage is applied, so that a plasma is produced between the substrate and the gas showerhead. Coating of curved substrates is not described.

In M. Heming et al., "Plasma Impulse Chemical Vapor Deposition—a Novel Technique for Optical Coatings," in 5. Meeting Opt. Interference Coatings, Tuscon 1992, the use of a gas showerhead and PICVD for the uniform coating of even substrates is described. If curved substrates are coated using this method but without fitting a counter-surface (gas showerhead) against the substrate curvature, a coating that becomes more uneven the greater the curvature of the substrate can be expected.

During the coating of substrates with a PICVD process, a gas chamber above the substrate is filled with coat forming material, which is transformed to coating material in a plasma impulse. The period of the consequent impulse pause is selected to ensure a complete exchange through unburned gas.

In the application of the PICVD process, it is assumed that a uniform coating of substrates can be achieved when the products $K_i \times V_i$ are approximately constant, or more exactly, when the integral in the first approximation is:

$$h_i = h_L$$

$$F_i * \int K(h_i) dh_i = \text{const}$$

$$h_i = 0$$

whereby $K(h_i)$ is the concentration of the coating formation gas at a distance h from the substrate, $F_i$ is the surface element of the substrate, and $h_i$ the amount of gas volume that contributes to the coating formation on the substrate since the thickness of the coating obviously depends to the greatest extent on the amount of coating formation material in volume element $V_i$ above the surface element to be coated.

A numerical simulation of the flow (solution of the Navier-Stokes equation) and the coating formation applied to the PICVD coating of a convex and a concave substrate surface confirms this expectation.

The simulation for the production of a $TiO_2$ coating from a $TiCl_4O_2$ gas mixture with a convex curvature radius Ks=122 mm on the substrate surface only results in a uniformity of U=0.71 (U=relation of minimum to maximum coat thickness) for a PICVD coating with microwave stimulation and the usual coating parameters, and the application of a gas showerhead and a constant mass flow from the gas emitting surface. The uniformity is only U=0.6 with the stronger curvature Ks=80. The thickness of the coating is a maximum at the edge of the substrate and a minimum in the middle. Experiments with convex substrates demonstrate that the thickness at the edge was probably correspondingly thicker because of the higher gas column above the substrate at the edge versus a lower gas column in the middle of the substrate. A reverse result of the coating thickness was achieved with concave substrates.

SUMMARY OF THE INVENTION

It is an object of the present invention to develop a procedure for the determination of process parameters for a PICVD process in the production of coatings with uniform process parameters on curved substrates and to develop a manufacturing process and a device to coat curved substrates, such as lenses and spectacles, in an economic fashion with a high uniformity of thickness of the coatings.

To achieve the stated and other objects of the present invention, as embodied and described below, the invention includes a process for the determination of process parameters for a PICVD process for the manufacture of coatings of uniform thickness on curved substrates, especially lenses made of glass or plastics where the substrates surfaces to be coated are placed opposite the gas emitting surface of a gas showerhead where gas mixtures containing coating gas stream into a reaction chamber, where separated plasma impulses are generated through timed impulse pauses characterized by the fact that the impulse pauses for a substrate type to be coated in a first experimental run is changed gradually from an initial value $t_A$ in one direction to determine the optimal value $t_{aff}$ while keeping constant the size of the gas emitting surfaces and the gas mass flow until the coating thickness profile produced on the substrates do not show any further averaging.

To achieve the stated and other objects of the present invention, as embodied and described below, the invention further includes a PICVD process for the manufacture of coatings of uniform thickness on curved substrates, especially lenses made of glass or plastics where the substrates surfaces to be coated are placed opposite the gas emitting surface of a gas showerhead where gas mixtures containing coating gas stream into a reaction chamber, where separate plasma impulses are generated through timed impulse pauses wherein the impulse pauses for a substrate type to be coated in a first experimental run is changed gradually from an initial value $t_A$ in one direction to determine the optimal value $t_{aff}$ while keeping constant the size of the gas emitting surfaces and the gas mass flow until the coating thickness profile produced on the substrates do not show any further averaging.

To achieve the stated and other objects of the present invention, as embodied and described below, the invention includes a PICVD process for the manufacture of coatings of uniform thickness on curved substrates, especially lenses made of glass or plastics with a reaction chamber where one substrate support and at least one gas showerhead is situated which are connected to a supply line for fresh gas which consists of a coating formation gas or a mixture of coating formation gases whose mass flow can be adjusted via a control unit, the reaction partner gas and possibly one or more inert gases; and with a device for the production of plasma; and with a device to stop the undesirable plasma treatment of a substrate surface which should not be coated, characterized by the fact that the gas showerhead has a planer gas emitting surface or a concave or convex curved gas emitting surface having a curve that corresponds approximately with the average curve of the surface to be coated, the device for the production of plasma being a microwave device, the microwave device having the capability of pulsating in a range from 0.1 to 500 ms, and there being means to keep the negative pressure of $<10^{-3}$ mbar on the side of the substrate support at the fastened substrate or there being means for the simultaneous production of plasma on both sides of the substrate support with fastened substrate.

It was surprising that better uniformity in the coating thickness could be achieved by deviating from the usual procedure of selecting the impulse pauses until the reaction chamber is filled completely with unburned gas before each impulse. Instead, the impulse pauses are shortened in order to prevent complete gas exchange. This approach is useful with both convex and concave substrates, and its advantages are attributable to the fact that residual gas from the previous plasma impulse remains in the reaction chamber at the activation of the next impulse, and the combination is mixed more or less with the supplied unburned gas when the impulse pauses are changed. Obviously, the unburned gas front does not reach the substrate surface in all areas if the impulse pause is too short, and unburned gas volume cannot adapt itself in its form to the substrate surface. Thereby, there is approximately the same number of coating formation molecules between the substrate surface and the gas showerhead surface under each surface unit of the substrate surface. The coating thickness is therefore no longer determined by the number of volume elements between the substrate surface and gas showerhead surface.

This is also valid for concave curved substrates.

The unburned gases do not reach the areas of the substrate that are more distant from the gas showerhead in sufficient volume if the impulse pauses are further shortened. The result is an increasing lack of uniformity in the coating thickness.

It is obvious that the above remarks also describe the situation of an approximation to the optimal impulse pauses using small impulse pauses.

According to an embodiment of the present invention, a procedure to determine the process parameters for coating curved substrates was developed based on the discoveries described above. Depending on the complexity of the form of the lens surface to be coated, the procedures are as follows:

i. One can use conventional gas showerheads for surfaces with weak curvatures that have a proportion from $-0.07$ to $+0.07$ between crown height and lens diameter (:=concave). In a conventional gas showerhead all gas mass flow densities are the same from all emitting openings. The mass flow of the process gas mixture is set for one value, which is preferably between $0.8*r^2$ and $80*r^2$ (sccm), whereby r is the measured lens radius. A small value (between 0.1 and 2 ms) or a large value (typically 500 ms) can be selected as an initial value for the impulse pause. The impulse pauses are either lengthened or shortened until an optimal uniformity is reached with the characteristic impulse pause $t_{eff}$.

Uniformity numbers (=minimal coating thickness/maximal coating thickness) of 0.99 can be reached in the coating of such curved substrates using process parameters determined with this method. Depending on the desired substrate uniformity, a further optimization of the process parameters might not be necessary.

ii. Lenses with strong curvature and/or non-rotationally symmetric curvature.

In another example, in order to reach uniformity numbers greater than 0.98 for anti-reflection coatings, application of a conventional gas showerhead is insufficient for lenses with strong curvature and/or non-rotationally symmetric curvature. In this case, it proves advantageous to use a gas zone showerhead as a gas showerhead, the gas zone showerhead containing two zones, in order to optimize uniformity. The parameters to be optimized are then the geometric location of the gas zones (zone parameters), as well as the ingredients and mass flow of the process gas through the individual zones (gas zone parameters).

According to this embodiment, first one determines the characteristic time $t_{eff}$ that is optimal for a gas zone showerhead with random distribution of the process gases in a gas zone showerhead, but preferably with a distribution where the process gas is distributed in partial streams through the zones so that the mass flow density and the mixture of the process gas is the same at each position in the zone showerhead in reference to the change of the coating thickness distribution on the substrate as a function of the impulse.

Subsequently, the composition and/or material flows of the gases flowing through the sections are changed in such a manner that the concentration of layer formers and/or the material flow of gas containing layer formers are increased at those locations of the gas nozzle, at which the layer thickness on the opposite substrate was too low and vice versa, whereby the first approximation takes the just determined value $t_{eff}$ as the pulse interval. If the uniformity is not adequately high, the uniformity can be further optimized through iteration in the aforementioned manner by redefining $t_{eff}$ and optionally by subsequently adapting the section gas parameters. Similarly, it has been shown to be advantageous also to subject the other process parameters, such as the process pressure, to fine adjustment. The process parameters determined thus guarantee uniformity figures of virtually 1.00.

An alternative is to optimize, according to the methods of statistical test planning (Box and Hunter. *Statistics for Experimenters*. John Wiley & Sons, New York, 1978), by varying the section gas parameters and the pulse intervals.

As a rule, it suffices to use merely a gas section nozzle having three sections. Preferably, a gas section nozzle with a center circular section, a mid-section, and an outer annular section is used.

For lenses having a slight curvature, it has been found that the section gas parameters must be modified up to a maximum of ±10%, as compared to the adjustments for a conventional gas nozzle, in order to obtain the optimal coating thickness profile. For very complicated shapes it can be necessary to increase the number of sections. In particular, non-rotationally symmetrical shapes also need non-rotationally symmetrical section divisions.

It has been demonstrated that at a chamber pressure of 0.5 mbar and a total mass flow of 50 sccm for HMDSO/$O_2$ gas mixtures the value $t_{eff}$ for low HMDSO concentrations (<10%) ranges from 10 to 50 ms; for high HMDSO concentrations (>30%) the value is less than 10 ms; whereas for TiCl$_4$/O$_2$ gas mixtures $t_{eff}$ values ranging from about 50 to 100 ms are assumed. The $t_{eff}$ values depend inversely proportionally on the chamber pressure and the mass flow. The dependency of the $t_{eff}$ values on the gas composition correlates presumably with particular chemical processes during the separation procedure, which also have an impact on the plasma.

In order to reduce the gas phase reaction, which has a negative effect on the quality of the coating, the process pressure P in the reaction chamber is chosen preferably in such a manner that P×H ranges from 0.5 to 30 mbar×mm, where H represents the distance between the substrate and the gas permeable surface.

The length of the plasma pulse should be no longer, if possible, than the time needed by the layer forming molecules in the center to travel approximately 1/10 of the distance of the substrate diameter. At a pressure of 0.5 mbar, pulse durations ranging from 0.1 to 2 ms have been demonstrated to be suitable for oxidation reactions of HMDSO and $TiCl_4$ to $SiO_2$ and $TiO_2$, respectively.

At a given volume $V_i$ the thickness of the coating can be set by means of the concentrations $K_i$ with respect to space. In so doing, it is advantageous to position the substrate surface not too far from the gas permeable surface, so that $h_i$, and thus with fixed $F_i$, $V_i$ is as small as possible, in order to prevent uncontrolled gas streams in the reaction chamber. This is advantageous since the degree to which the different types of gases and/or concentrations mix has to proceed in a largely controlled manner. To this end, the distance H between the gas permeable surface and the substrate surface is preferably variable, so that different volumes can be set for the reaction chamber filled with plasma. Advantageous distances range approximately from 2 mm to 20 mm for H. At the same time it must be observed that the ratio between the smallest and the largest nozzle distance for a substrate ranges from 0.3 to <1, where values around 1 apply to planar substrates. The lens diameter can range from 10 to 150 mm.

Since the temperature of the make-up gases affects the coating rate, the nozzle is thermostatted to a temperature ranging from 20° to 100° C. Also important to coating rate is a defined temperature of the gas permeable surface, which is made preferably of metal, since this surface constitutes the interface of the plasma.

Preferably the residual gas is pumped off over the edge of the gas section nozzle and conveyed to the center. For rotationally symmetrical substrates, it is advantageous to pump off the residual gas in a rotationally symmetrical manner.

Since each coating comprises multiple single layers, as is the case, for example, for scratch-proof layers and antireflection layers on eye glasses, several coating procedures are necessary. In so doing, the scratch-proof and antireflection layer can be applied in succession without flooding the reaction chamber, since, owing to the defined reaction space and the high plasma density, the material can be almost totally converted, and thus the formation of particles can be largely suppressed.

A microwave PICVD process can be used as the plasma pulse process, or the plasma CVD separation can be induced by HF pulses, whereby the field strength of the exciting electromagnetic radiation in the space, which contributes to the coating, over the layer of substrate to be coated, exceeds a threshold value, as needed to convert the gas containing the layer formers into the layer material.

It is advantageous to set the electromagnetic field for generating the plasma, such that the field's symmetry is adapted to the symmetry of the substrate; for example, rotational symmetry for rotationally symmetrical substrates, such as eye glasses. How this is to be done, such as with the aid of a stub tuner unit, which exploits the interference effects, is known to the expert and described, for example, in Meinke/Gundlach. *Handbook for HF Technology*. Springer Verlag, 1968.

If two surfaces of a substrate are to be coated, both surfaces can be coated simultaneously, each surface being placed opposite its own gas permeable surface.

However, it is also possible to coat both surfaces in succession, whereby the respectively free surface, when not being coated, must be protected. This can be done by placing the free surface in a chamber, where the pressure is maintained so low that the plasma cannot ignite (approx. <0.001 mbar).

The coating process according to an embodiment of the present invention is applicable especially to antireflection coating on lenses and eye glasses and to scratch-proof and antireflection coating for eye glasses and lenses made of plastic or scratch-sensitive material. The substrates to be coated are made, for example, of glass, polycarbonate or CR 39 (CR 39 is diethylene glycol-bis-ally carbonate).

The process for determining the process parameters is preferably conducted as follows for an embodiment of the present invention.

Following insertion of the substrate into the substrate holder, the holder is installed into the coater, which works, for example, according to a microwave plasma pulse CVD process. The desired layer system with the respective thickness of the related single layers and the process parameters are than entered into the control computer of the coater. The coating program is started by pushing a button and runs in accordance with the control program, which also includes the flooding and opening of the coater. The following process parameters are entered: composition and mass flows of the gases flowing in through the individual sections; start value $t_A$ of the pulse interval; power of the exciting electromagnetic radiation; pressure in the reaction chamber, which ranges preferably from 0.1 to 2 mbar; and temperature of the gas nozzle plate.

Then the coating is performed and the layer thickness profile is measured. Subsequently, other substrates of the same type are coated in the same manner, whereby only the pulse interval is modified. If the measurements of the layer thickness profile show no more improvements, or if, with additional changes of the pulse intervals—reducing or increasing the pulse interval—the layer thickness profile get worse, then the first series of tests is terminated, and the best layer thickness profile is assigned to the related pulse interval as $t_{eff}$. Then, a second series of tests is conducted with other substrates of the same type, with variations in the section parameters and the section gas parameters, whereby $t_{eff}$ is largely held constant.

It has been shown that the series of experiments has to be conducted only for the boundary shapes of the substrate types and that the parameters for coating the intermediate shapes can be determined through interpolation of the process parameters. In this manner the experimental effort to determine the process parameters can be reduced.

To enable an integration into a production process, the coating is done preferably with small batch sizes, preferably the batch size 1.

The plasma CVD apparatus is characterized by the following features: a reaction chamber in which one substrate support and at least one gas showerhead are situated, which are connected to a supply line for fresh gas, which consists of a coating formation gas or a mixture of coating formation gases whose mass flow can be adjusted via a control unit, the reaction partner gas and possibly one or more inert gases; a device for the production of plasma, and a device to stop the undesirable plasma treatment of a substrate surface which should not be coated, the device for the production of plasma characterized by the fact that the gas showerhead has a planar gas emitting surface or a concave or convex curved gas emitting surface, having a curve that corresponds approximately with the average curve of the surface to be coated, the device for the production of plasma being a microwave device, the microwave device having the capability to pulsate in a range from 0.1 to 500 ms, there being means to keep the negative pressure of $<10^{-3}$ mbar on the side of the substrate support at the fastened substrate, or there being means for the simultaneous production of plasma on both sides of the substrate support with fastened substrate. Preferably, the apparatus exhibits a gas section nozzle. The gas section nozzle exhibits planar gas permeable surfaces and preferably internal elements to even out the mass flow density in the gas nozzle or in the individual gas sections.

In an embodiment of the present invention, the gas permeable surface is advantageously provided with holes for the passage of gas, and section elements are arranged as gas distribution systems below the gas permeable surface. The gas distribution systems define the sections and/or can be modified by an adjustment mechanism and/or exhibit at least one flexible wall; and/or a mask with specified hole pattern is provided between the gas section nozzle and substrate.

The individual sections of the gas section nozzle are attached to the feed lines for make-up gas, to which specified different quantities of gas containing layer formers can be blended by means of controllable devices. Thus, the make-up gas, conveyed through the sections into the reaction chamber, can contain varying concentrations of layer forming material. Surprisingly, gas section nozzles, which were used to date only for coating flat substrates, have also withstood the test for coating curved substrates.

For circularly symmetrical substrates, the gas section nozzle is made, for example, of at least two concentric cylinders, which allow coating individually with gas mixtures, whereby the flow of the gas mass from a cylinder can also be zero. Thus, the diameter of the cylinder, as compared to the substrate geometry, is relevant to uniformity. For lenses with astigmatic effect (e.g., cylindrical lenses) the cylinders of the gas section nozzle are deformed preferably in the direction of the axis of the cylinder of the cylindrical lens (e.g., into an ellipse or a rectangle). This deformation must apply at least to the section cylinder, which contributes the bulk of the coating gas mixture. To be flexible for varying substrates with and without astigmatic effect, the concentric sections are deformable preferably in a manner that is reversible and may be applied elliptically.

Another flexibility of the device is achieved by adjusting the distance between the head plate of the gas section nozzle and the surface to be coated. The actual reaction chamber can exhibit a volume ranging from 1 to 500 cm$^3$. Preferably the gas section nozzle exhibits boreholes having diameters ranging from 0.1 to 10 mm in the area of the sections in the head plate.

In addition, the plasma CVD device can include, between the gas passage surface and the substrate to be coated, one or more masks, with which a specified distribution of the gas streams on the substrate surface can be obtained. The pattern of the individual masks is adjusted to the surface shape of the substrate to be coated. Therefore, preferably, masks that can be integrated into the substrate holder are also used.

If the two surfaces of a substrate are to be coated in succession, the substrate is located in the separating wall between the reaction chamber and a vacuum chamber, so that the respective surface of the substrate that is not to be coated is located in the vacuum chamber, and the surface to be coated is located in the reaction chamber. The pressure in the vacuum chamber is set so low that no plasma can ignite. In this manner, when one side is being coated, the other side is prevented from also being coated, a state that would occur under uncontrolled conditions.

To generate and excite the plasma, a HF device or a microwave device can be provided.

If a microwave device for generating and exciting the plasma is installed on both sides of the substrate, the reaction chamber is built preferably into a microwave rectangular waveguide, whereby the gas section nozzle is constructed in such a manner that gas is fed in and siphoned off through the wide sides of the rectangular waveguide.

In another preferred embodiment, the reaction chamber can also be built into a cylindrical resonator, where the head plate is preferably identical to the cylinder bottoms, so that the gas can be fed in and siphoned off through the cylinder bottoms. The microwaves are coupled into the cylindrical resonator preferably from a revolving rectangular waveguide, having slots, so that slot coupling is possible. Another embodiment includes a wire loop coupling.

According to another preferred embodiment, the microwaves are coupled into the cylindrical resonator by means of a Lisitano coil.

If simultaneous coating of both sides is provided, the substrate holder is arranged in the center of the reaction chamber and each of the surfaces to be coated has its own gas section nozzle.

Additional objects, advantages and novel features of the invention will be set forth in part in the description that follows, and in part will become more apparent to those skilled in the art upon examination of the following or upon learning by practice of the invention.

BRIEF DESCRIPTION OF THE DRAWINGS

In the figures:

FIG. 13 depicts layer thickness profiles for a $SiO_2$ layer on a curved substrate for a pulse interval of $t_{eff}=10$ msec for varying section parameters in accordance with an embodiment of the present invention;

DETAILED DESCRIPTION

Figure 1:
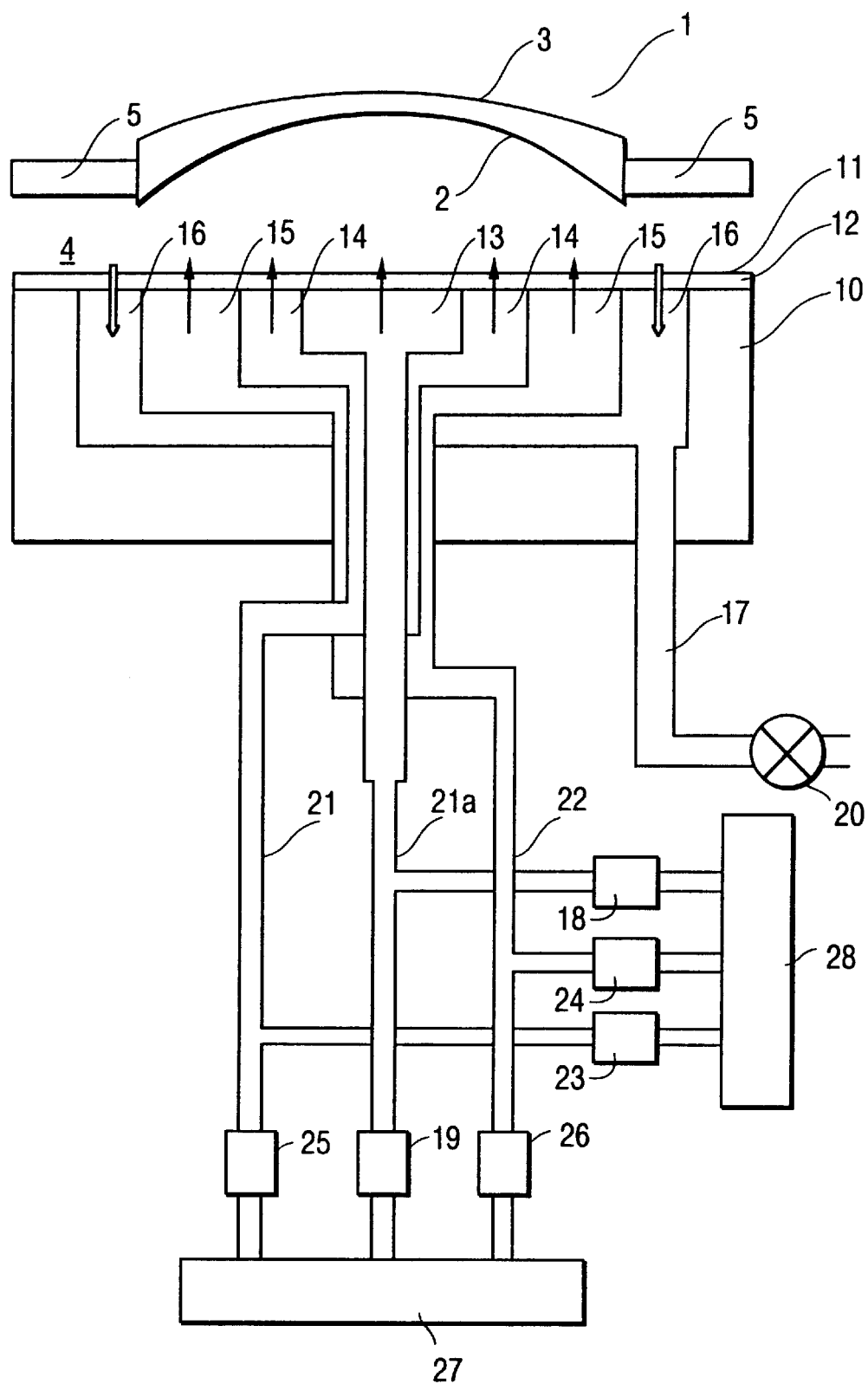
FIG. 1 is a schematic of the device with gas section nozzle, according to an embodiment of the present invention.

FIG. 1 is a schematic of a plasma CVD device, according to an embodiment of the present invention, for coating curved substrates. The substrate 1 with surfaces 2 and 3 is held in a substrate holder 5, which is made, at least in part, of a dielectric material, so that in the case of microwave excited plasma the propagation of the microwaves is not prevented. The concave substrate surface to be coated defines the reaction chamber 4, for which the underside is defined by a head plate 12 of a gas section nozzle 10. The upper side of the head plate 12 forms the gas permeable surfaces 11. The gas section nozzle 10 exhibits four sections 13, 14, 15 and 16, in which the outer section 16, located outside the substrate, serves to siphon off the residual gases. Section 16 is connected by means of a suction line 17 to a pump 20. The sections 13, 14, and 15 for feeding make-up gases are attached by means of feed lines 21, 21a and 22 with gas mass flow controllers 19, 25, 26 to a source for nonlayer-forming gas 27, and by means of gas mass flow controllers 18, 23, 24 to a gas source 28 for feeding make-up gas.

Figure 2:
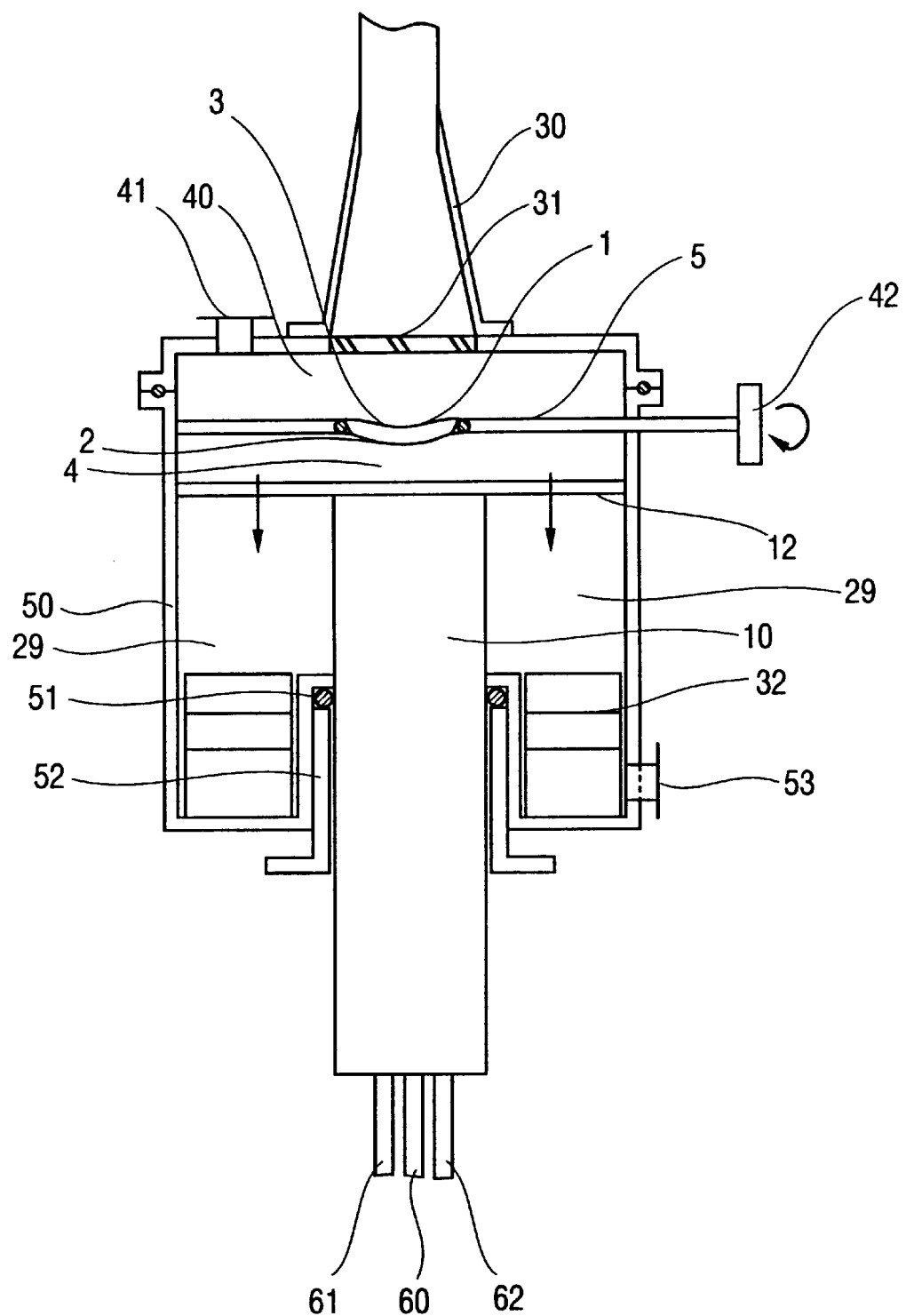
FIG. 2 depicts a device for one-sided coating, according to an embodiment of the present invention.

FIG. 2 depicts a device in accordance with an embodiment of the present invention, with which both sides of a substrate 1 can be coated in succession. The substrate 1 is placed in a substrate holder 5 between a vacuum chamber 40 and the reaction chamber 50. Both chambers 40, 50 are separated gas-tight from each other by means of a conventional O-ring seal (not illustrated) through holder 5 and substrate 1. The vacuum chamber 40 is attached to a suction line 41, so that a pressure, which is lower than the pressure in the reaction chamber 50, can be set in the vacuum chamber 40, so that, when plasma is generated in the reaction space 4, there is no plasma reaction in the vacuum chamber 40. Thus the surface 3 of the substrate 1 is prevented from being subjected to undesired coating.

The microwaves for generating and exciting the plasma are directed in through a waveguide 30, whose end is closed by means of a microwave window 31 opposite the vacuum chamber 40. The reaction chamber 50 is defined by the gas section nozzle 10, which is provided with make-up gas by means of the feed lines 60, 61, 62. The gas section nozzle 10 is held by a guide 52 and can be slid in the guide 52. The gas section nozzle 10 is connected to the reaction chamber 50 so as to be vacuum-tight via sealing elements 51, which are pressed down by means of the guide 52, which is designed simultaneously as a screw. After loosening the guide 52, the gas section nozzle 10 can be moved to a specified distance from the substrate 1. Another possibility is to connect the gas section nozzle 10 to the reaction chamber 50 by means of a vacuum-tight corrugated hose, so that the distance between substrate 1 and the gas section nozzle 10 can be adjusted without any additional measures, even during the coating process.

The residual gas is siphoned off through the electrically conductive head plate 12 of the gas section nozzle 10 by means of the outer ring section 29, whereby deflectors 32 make the laterally coupled suction power rotationally symmetrical or enable the specified azimuthal distribution profile to be adjusted. The residual gases are siphoned off over the residual gas line 53. Following completed coating, the substrate 1 can be rotated with the holder 5 by means of the revolvers 42, so that even the convex surface 3 can be coated in a second step.

Figure 3:
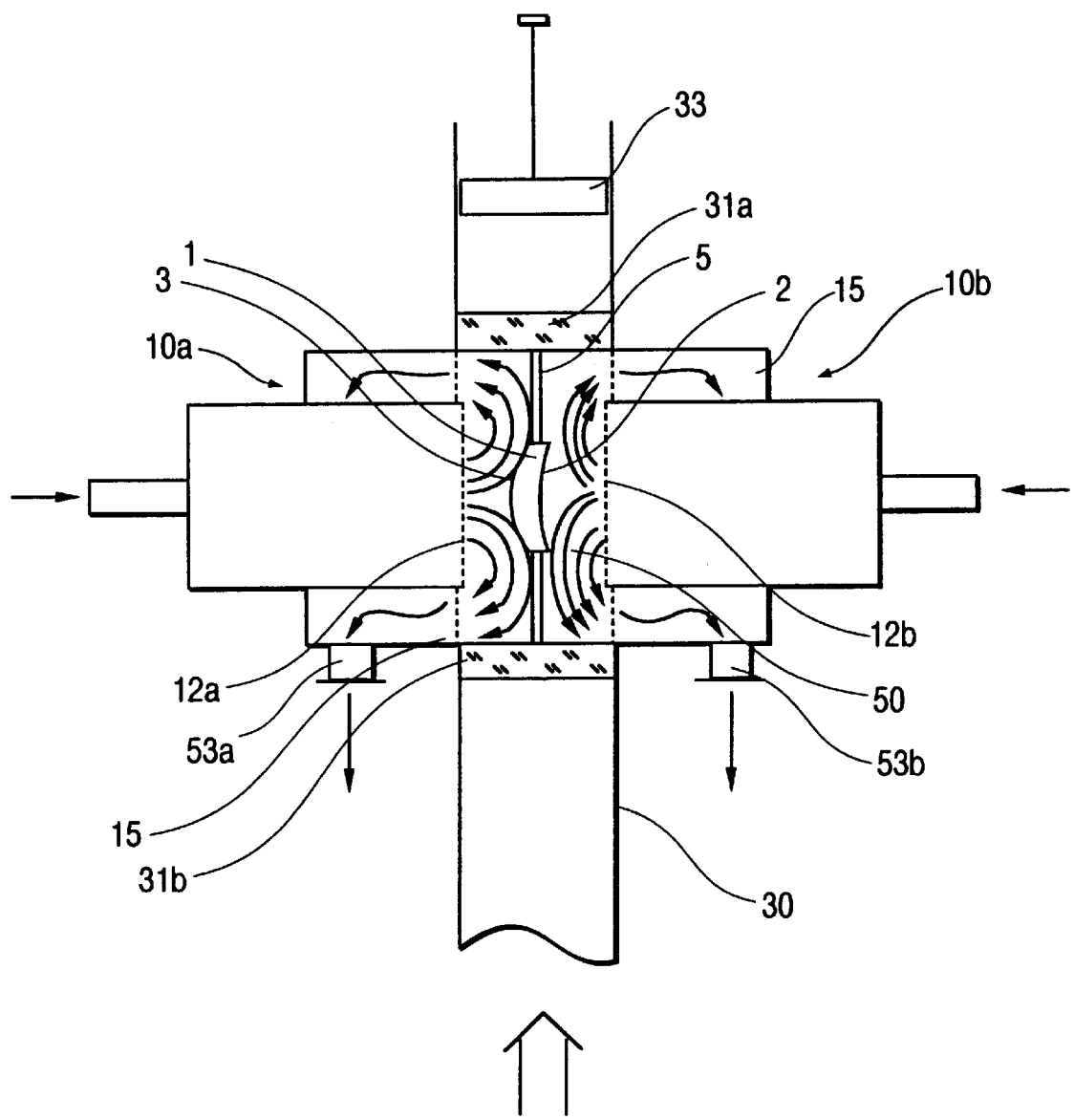
FIG. 3 depicts a device for simultaneous, two-sided coating according to the embodiment of FIG. 1.

FIG. 3 depicts a device according to an embodiment of the present invention for simultaneous, two-sided coating of a substrate 1, which is located in the center of a reaction chamber 50. The two opposite sides of the surfaces 2 and 3 have gas section nozzles 10a, 10b, having head plates 12a, 12b that are components of the rectangular waveguide 30, by means of which the microwaves are coupled into the reaction chamber 50. The reaction chamber 50 is closed by means of the microwave windows 31a, 31b. The opposite side of the microwave rectangular waveguide 30 has a short-circuit slider 33. The gas section nozzles 10a, 10b exhibit several concentric sections, through which the make-up gas is fed into the reaction chamber 50. The residual gas is sucked off through an outer ring section 15.

Figure 4:
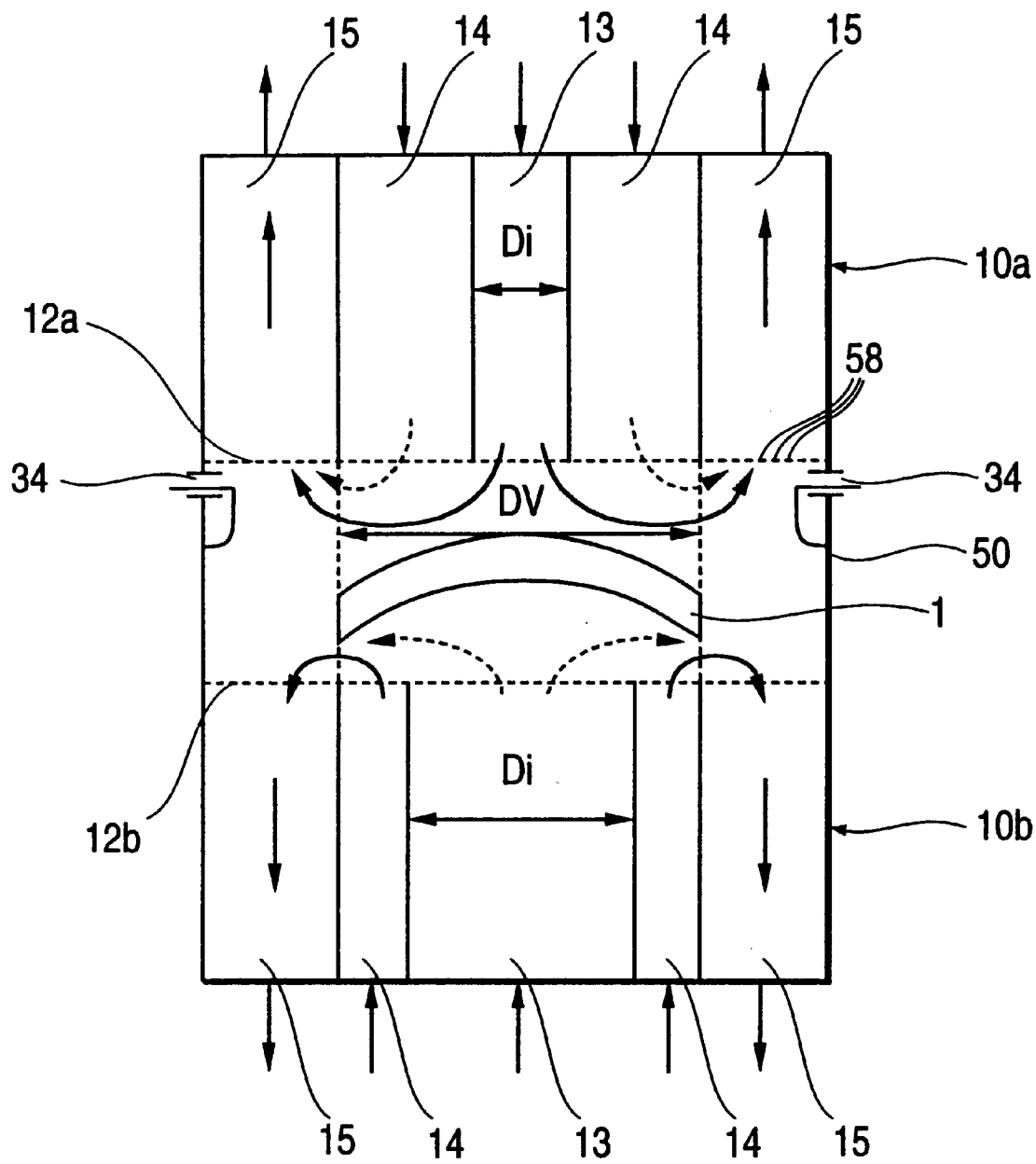
FIG. 4 depicts a device for simultaneous, two-sided coating according to another embodiment of the present invention.

FIG. 4 depicts another embodiment, in which the reaction chamber 50 is a component of the cylindrical resonator. The microwaves are coupled by means of an inductive coupler 34. The two gas section nozzles 10a and 10b, which are opposite the substrate 1, vary with respect to the size of the sections 13, 14, and 15. The diameter of the substrate to be coated is $D_v$ in the picture shown here. The inner diameter $D_i$ of the central section 13 of the bottom gas section nozzle 10b for coating the convex side is just slightly less than the diameter $D_v$ of the substrate, and amounts to approximately $0.8 \times D_v$. The section 14 is designed to be correspondingly relatively narrow.

At the upper gas section nozzle 10a for coating the concave side, the inner diameter of the central section 13 has a diameter value of $0.2 \times D_v$. Correspondingly the section 14 is larger. The sections 15 are the same size in the gas section nozzles 10a and 10b.

Figure 5:
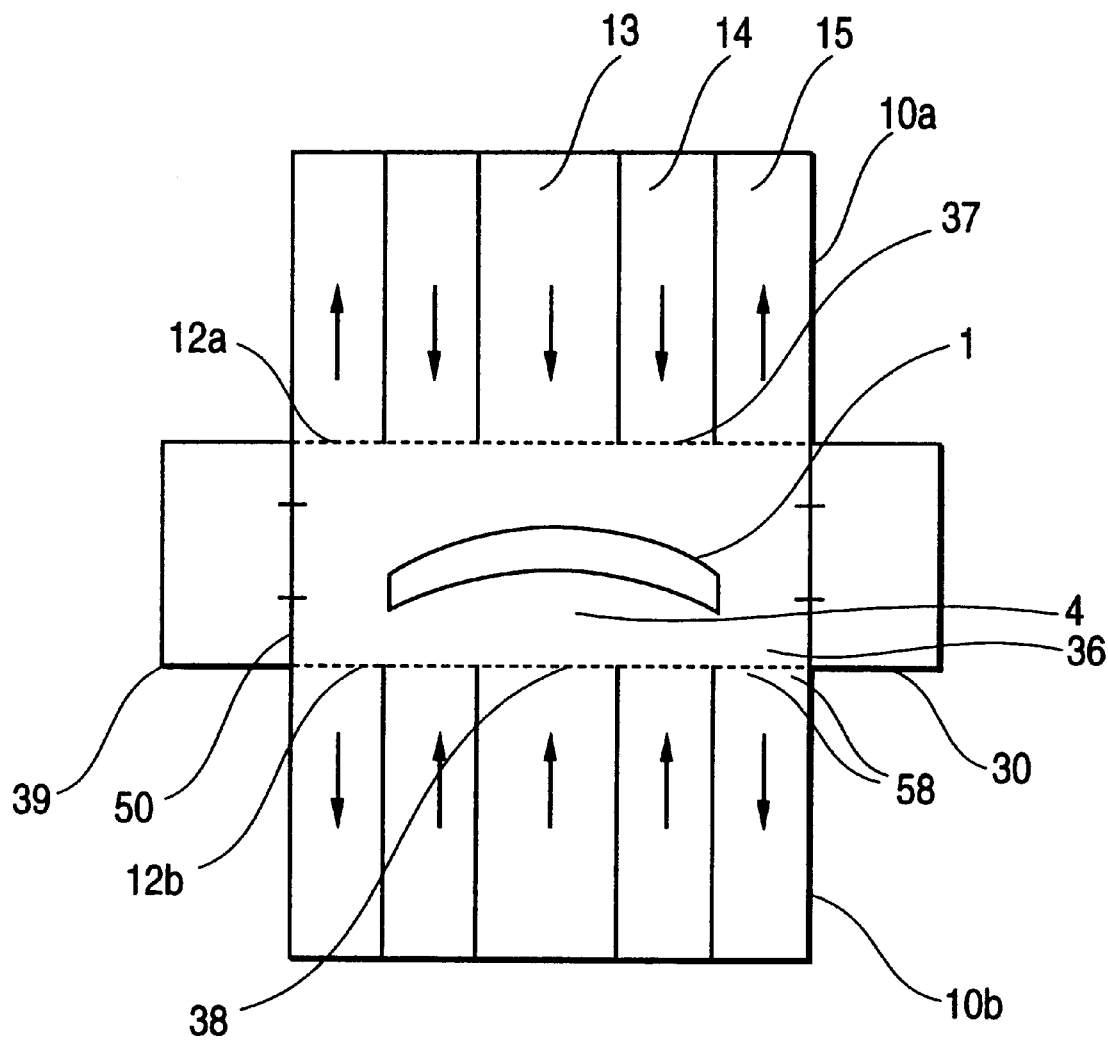
FIG. 5 depicts a device for simultaneous, two-sided coating according to another embodiment of the present invention.

FIG. 5 depicts another embodiment, in which the reaction chamber 50 is designed in the shape of a cylindrical resonator 36 and is surrounded by a rectangular waveguide 39. The waveguide has slots for coupling the microwaves into the reaction space 4. The head plates are identical to the cylinder bottoms 37, 38.

Figure 6:
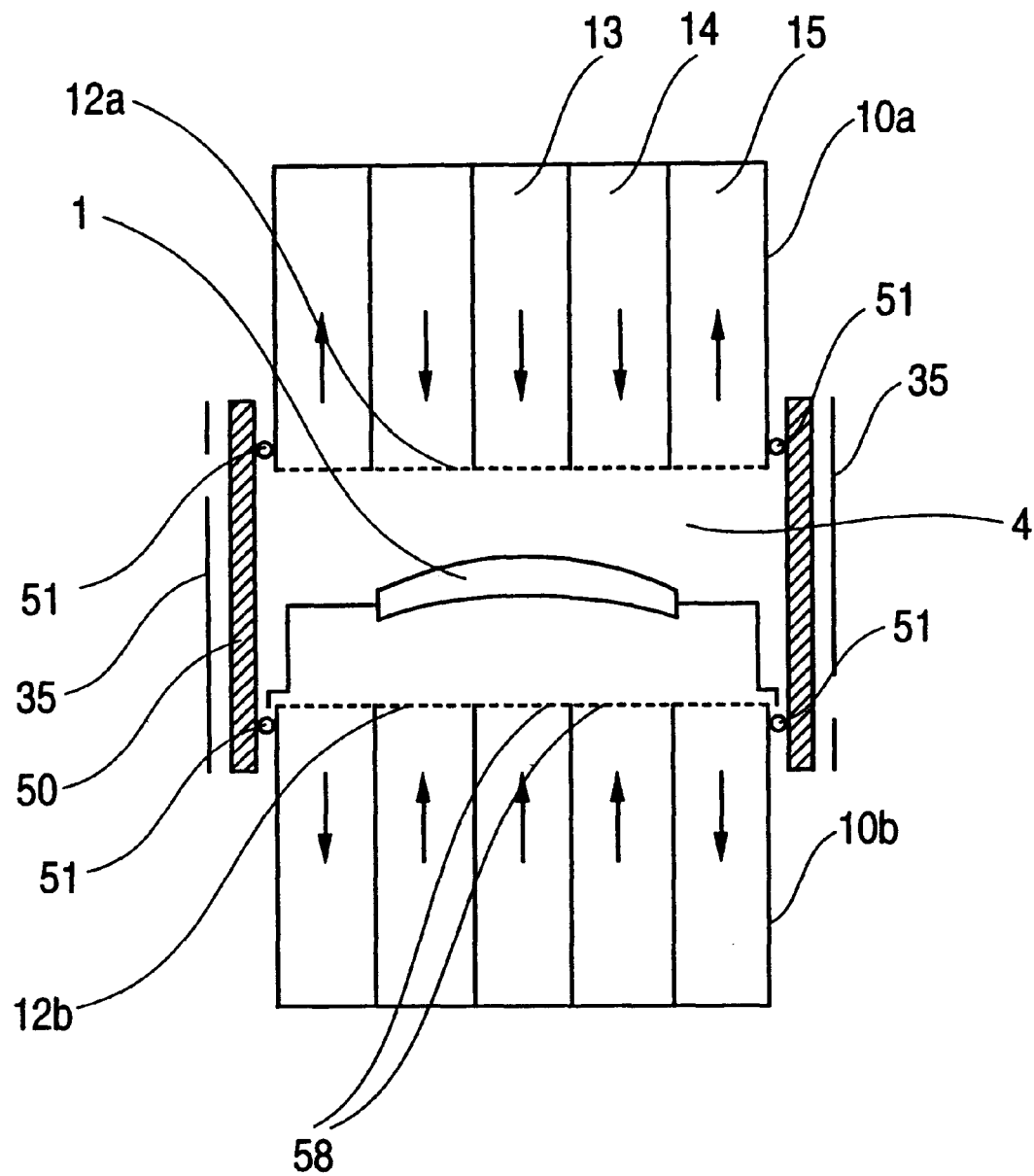
FIG. 6 depicts a device according to another embodiment of the present invention.

FIG. 6 depicts another embodiment, in which the reaction chamber 50 is enveloped by a Lisitano coil 35.

Figure 7A:
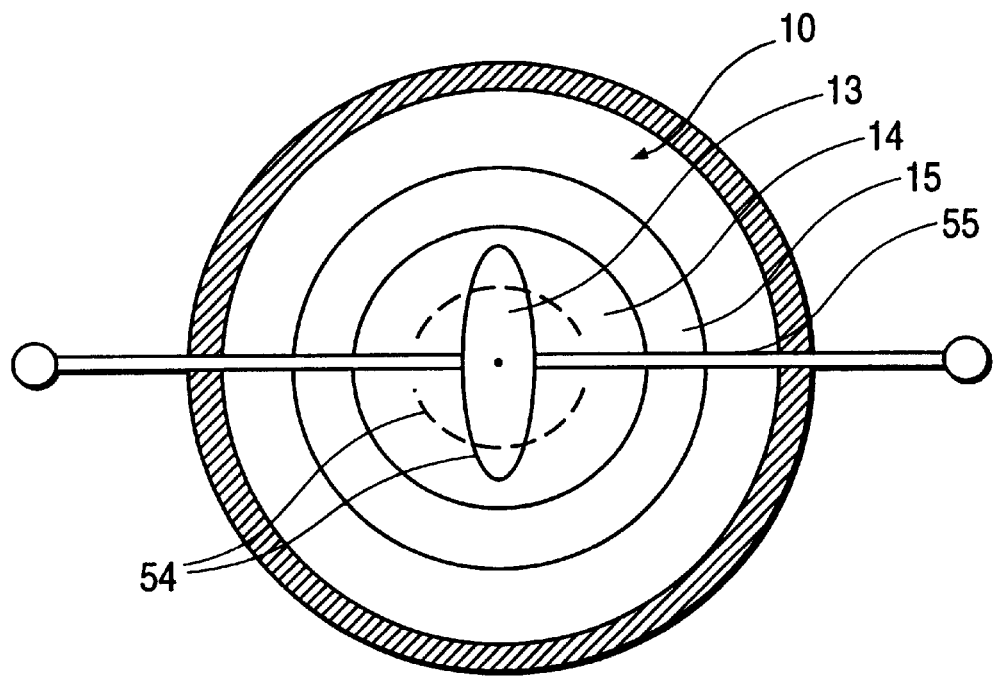
FIGS. 7a and 7b depict a gas section nozzle with adjustable sections according to an embodiment of the present invention.
Figure 7B:
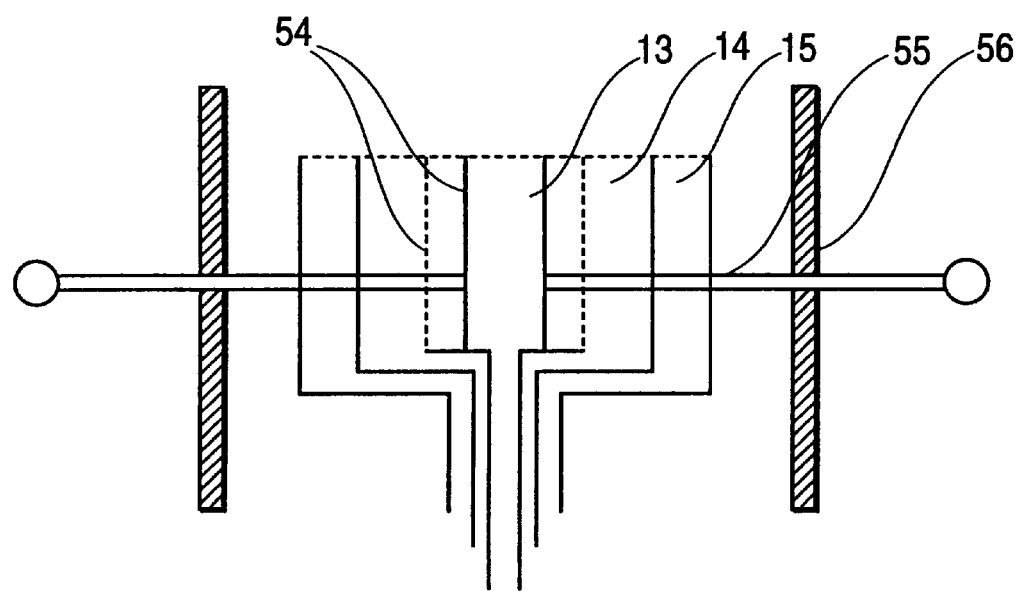

FIGS. 7a and 7b are basic drawings of a gas section nozzle with three sections 13, 14, 15, in which the inner cylinder 54 can be deformed reversibly elliptically from the outside. Such a gas section nozzle 10 is also suitable for coating astigmatic eye glasses, in which case the cylindrical axis of the substrate is arranged in the direction of the large elliptical axis.

The deformable cylinder 54 is made of flexible material, such as a 0.1 mm thick stainless steel sheet, having two side actuating shafts 55 that are connected rigidly or flexibly. The shafts 55 pierce the remaining cylinders and can be actuated by means of sliding passages in the outer wall 56 of the reactor. No demands are made on the sealing of the boreholes in the cylinders through which the shafts 55 are pushed, since the pressure differential between the cylinders is very small. Depending on the diameter of the shaft and the pressure in the gas section nozzle, the shaft 55 should be spaced sufficiently far from the head plate, so that the flow profile of the issuing gas is not disturbed.

Depending on whether make-up gas or, for example, gas without a layer former flows through the elliptically deformed center cylinder, the local coating rate in this region of the substrate is increased or reduced, so that eye glasses with opposite cylindrical effects can be coated.

Figure 8:
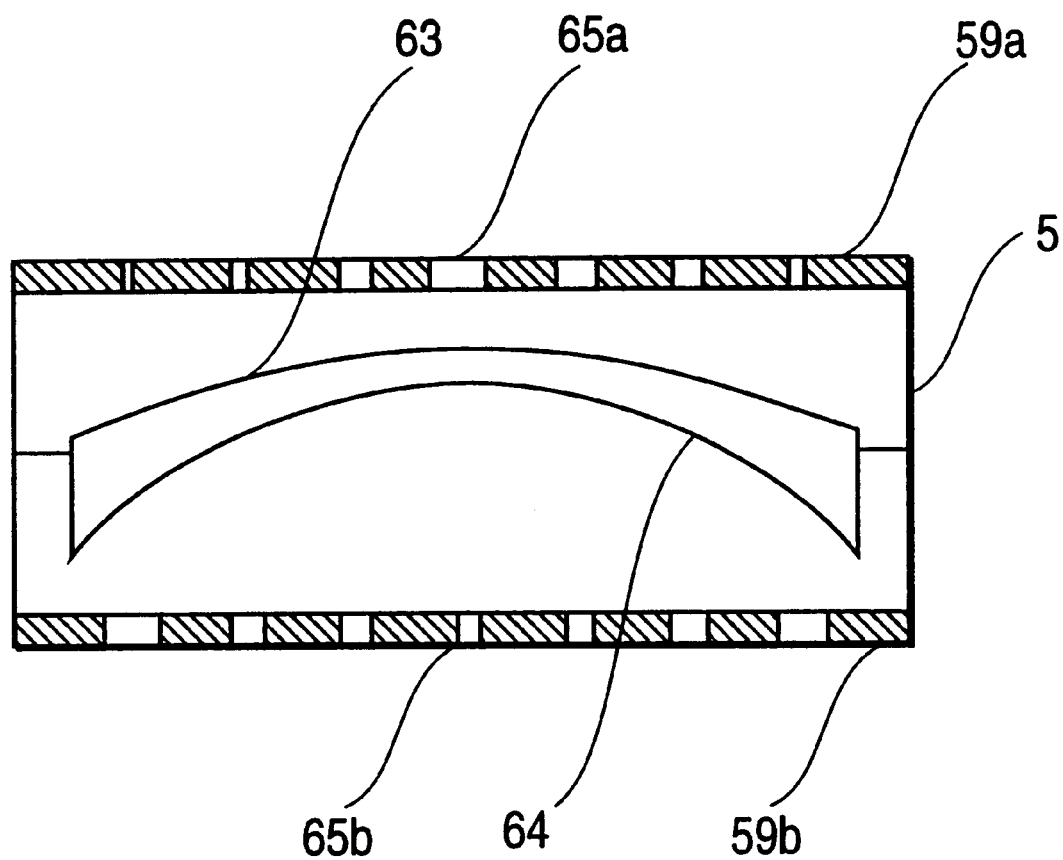
FIG. 8 depicts a substrate holder with integrated masks for simultaneous, two-sided coating according to an embodiment of the present invention.
Figure 9A:
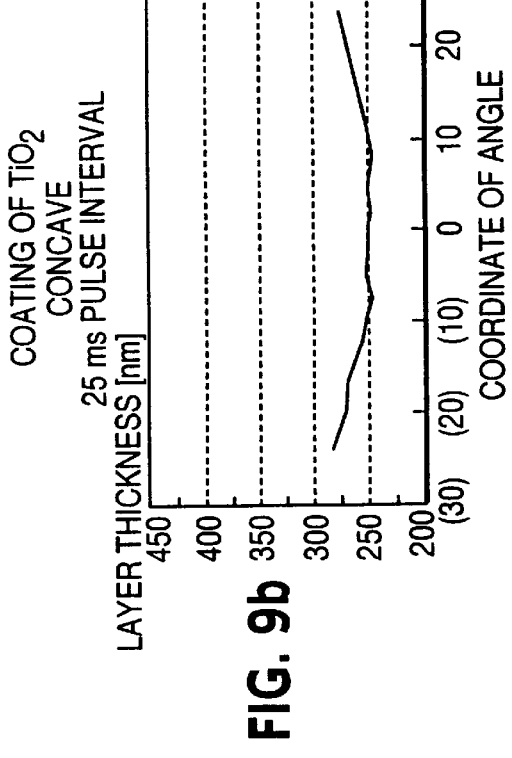
FIGS. 9a, 9b, 9c, and 9d depict layer thickness profiles of a $TiO_2$ layer on a concave substrate with a conventional gas nozzle according to an embodiment of the present invention.
Figure 9B:
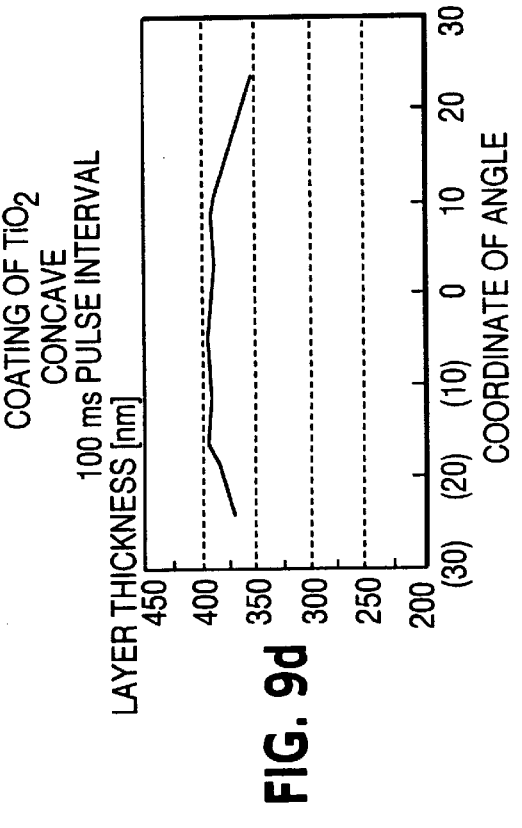
Figure 9C:
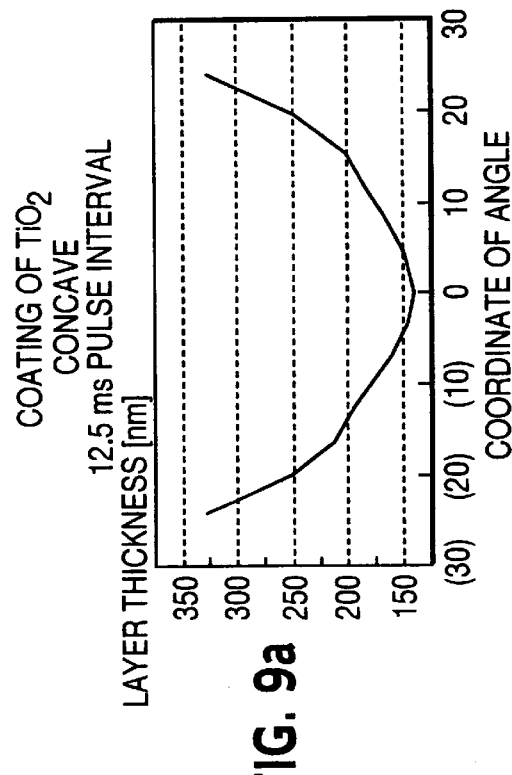
Figure 9D:
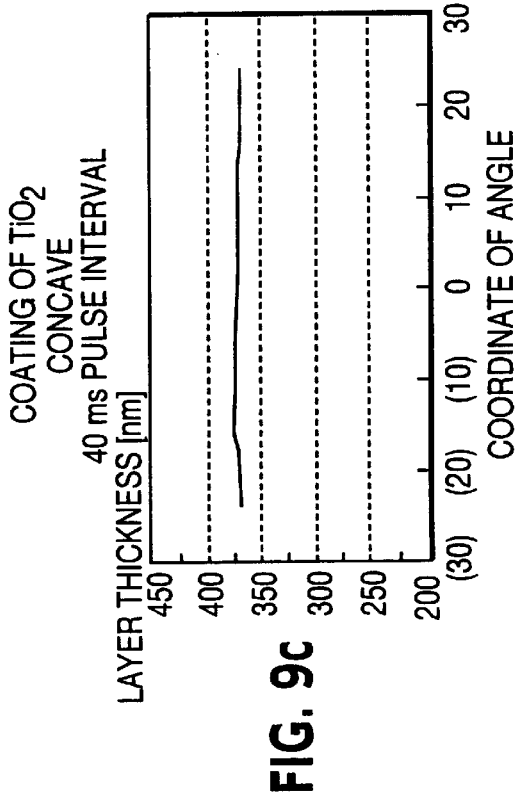

FIG. 8 depicts two masks 59, which are integrated into a substrate holder for simultaneous two-sided coating in accordance with an embodiment of the present invention. Here one can see that the mask 59a, assigned to the convex substrate surface 63, exhibits in the center, where the distance between mask and substrate is the smallest, a larger diameter than on the periphery, where the distance between mask and substrate is larger. On the opposite side, the conditions are precisely the reverse for the mask 59b, which is assigned to the concave substrate surface 64. The decisive factor is that the size of the mask holes 65 is measured in such a manner that the inflow of make-up gas is not affected, and the infeed of layer-forming molecules, contributing to the coating of the substrate is constant with respect to the specified tolerance of the layer thickness.

A first series of tests was conducted with a device according to FIGS. 1 and 2, in which a three sectional gas section nozzle, divided into a circular center section, an annular mid-section, and an annular outer section, was used. Before the series of tests was started, a rotationally symmetrical microwave field was generated by adjusting the tuning elements (stub tuner).

The concave side of a CR 39 lens (radius of curvature 80 mm, lens diameter 70 mm) was provided with a highly refractive $TiO_2$ layer. The process parameters were as follows:

pressure: 0.5 mbar total material flow: 100 sccm $TiCl_4$ ratio: 6.3%

A conventional gas nozzle was used as the gas nozzle. FIGS. 9a–9d show the dependency of uniformity on the pulse interval, starting from a pulse interval of 12.5 ms for an embodiment of the present invention. At a pulse interval of 40 ms an optimal uniformity figure of 0.982 is reached, which is adequate for optical quality of an antireflection coating. For longer pulse intervals the uniformity decreases again.

The convex side of a CR 39 lens (radius of curvature 122 mm, lens diameter 70 mm) was provided with a scratch-proof layer made of $SiO_2$. The process parameters were as follows:

pressure: 0.5 mbar total material flow: 50 sccm

HMDSO ratio: falling linearly from 35% to 10%

The pulse power was increased linearly from 2 kW to 7 kW.

Figure 10A:
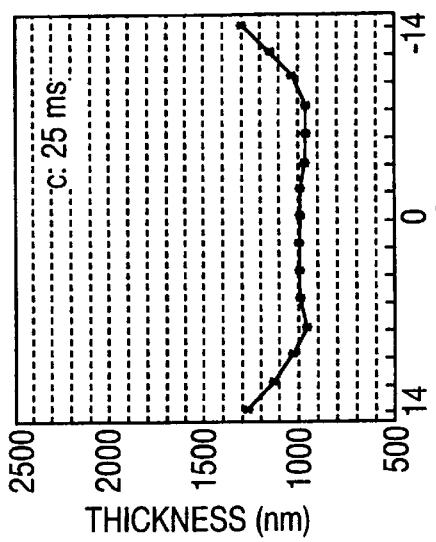
FIG. 10a, 10b, 10c, 10d, 10e and 10f depict an $SiO_2$ layer on a convex substrate (first test series) according to an embodiment of the present invention.
Figure 10B:
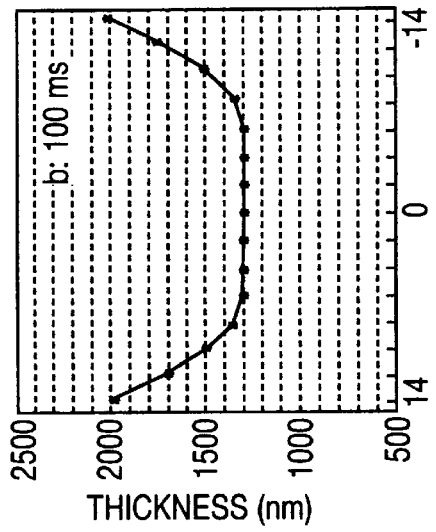
Figure 10C:
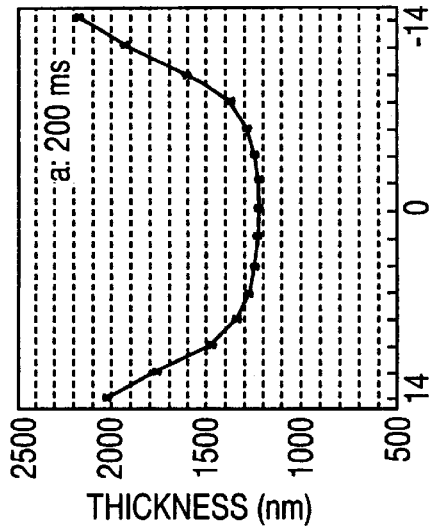
Figure 10D:
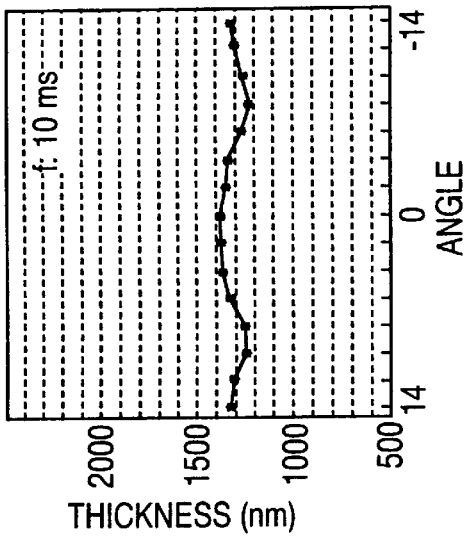
Figure 10E:
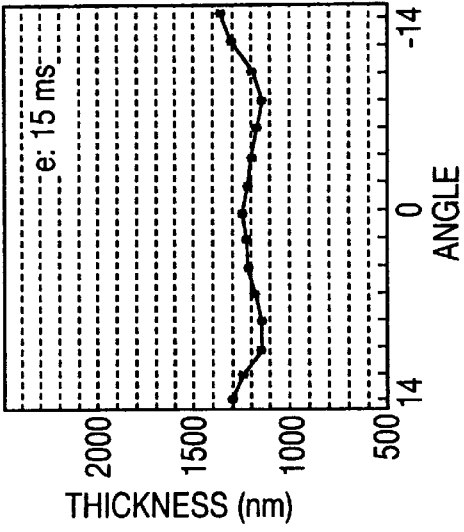

To show the impact of the pulse interval on the coating results, the process was started with a pulse interval of 200 msec, and the setting of the section parameters of the gas section nozzle was held constant (central section of the gas section nozzle completely opened and the other sections completely closed). FIG. 10a shows clearly raised edges that fall as the pulse interval shrinks, until a layer thickness curve has been reached in FIG. 10f that merely fluctuates between 1200 and 1400 nm in accordance with an embodiment of the present invention.

Figure 11:
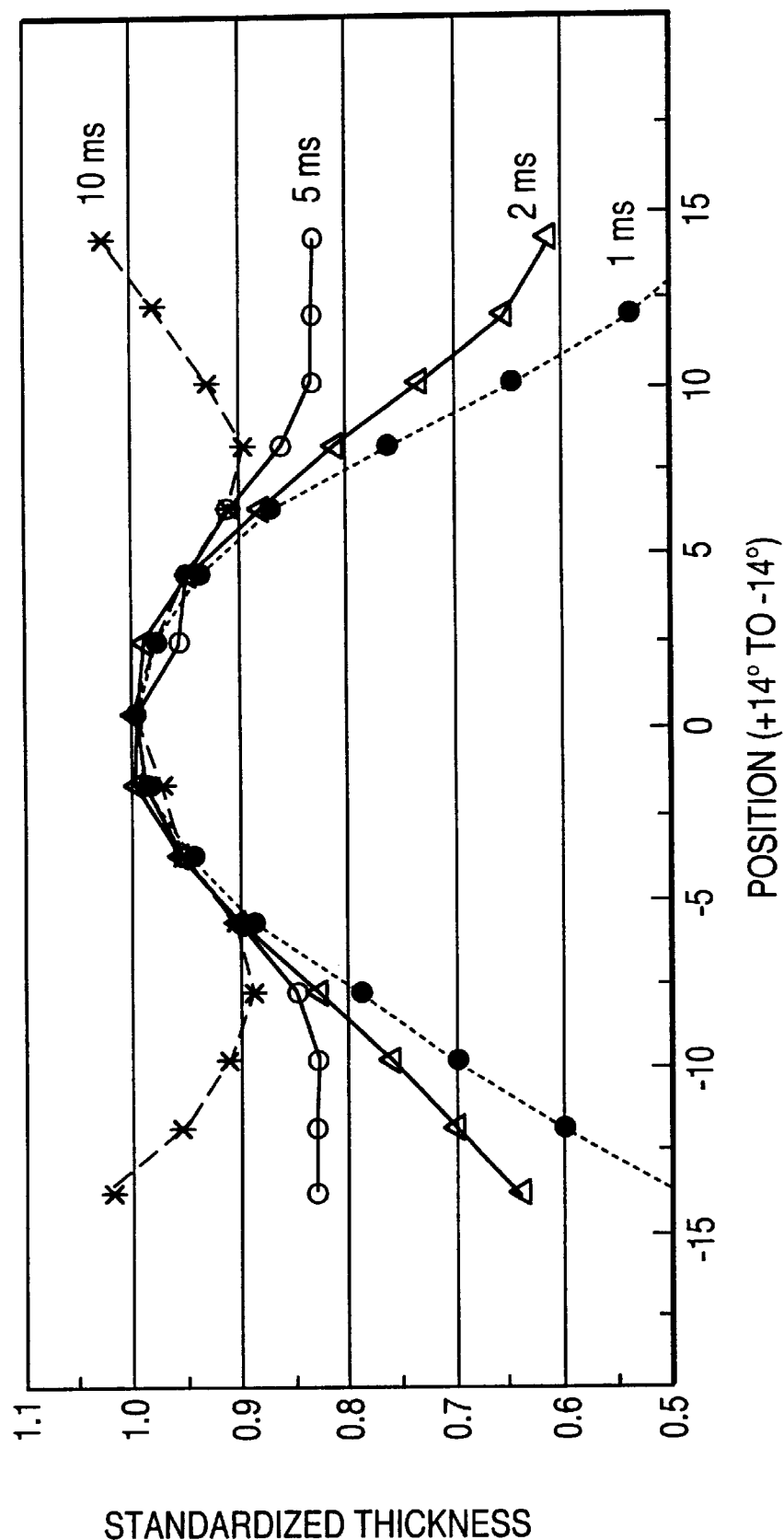
FIG. 11 depicts layer thickness profiles of a $SiO_2$ layer on a convex substrate for short pulse intervals according to an embodiment of the present invention.

If even shorter pulse intervals are used, as shown in FIG. 11, the increase in height of the edges decreases and, instead, the center of the substrate increases in height in accordance with an embodiment of the present invention. From this series of tests one can infer that the optimal pulse interval is approximately 10 msec.

Figure 10F:
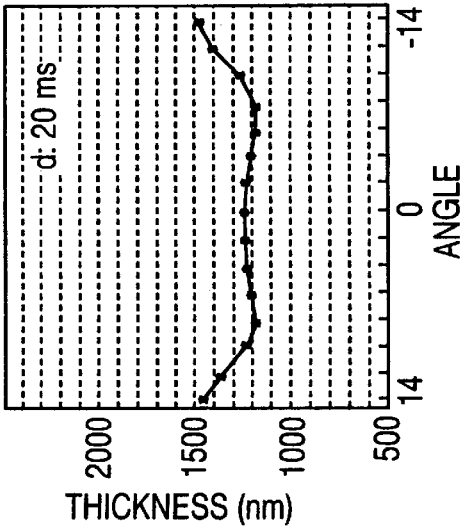
Figure 12:
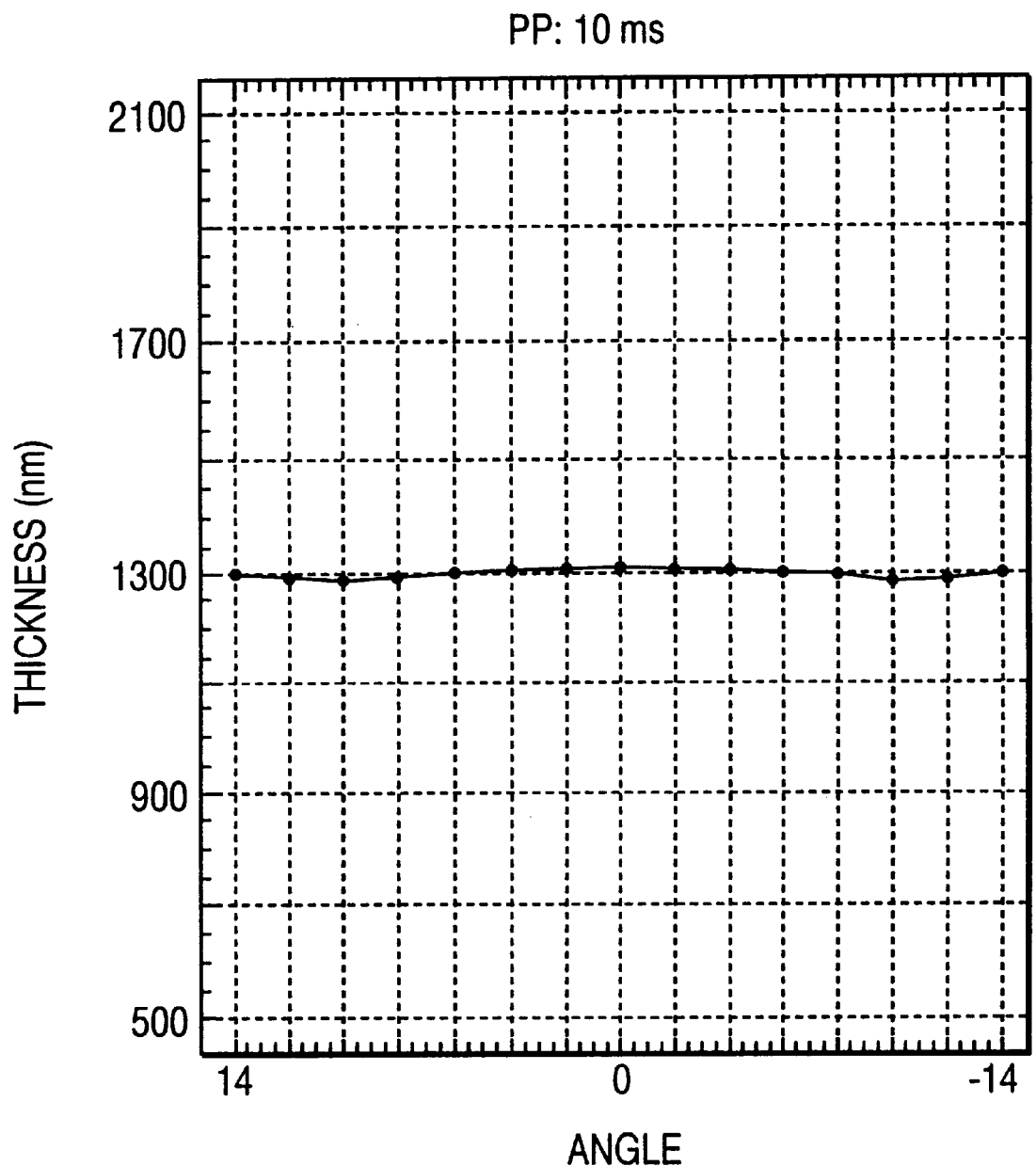
FIG. 12 depicts a layer thickness profile of a $SiO_2$ layer on a convex substrate, the profile being optimized according to the second series of tests in accordance with an embodiment of the present invention.

By modifying the material flow slightly, the layer thickness profile could be even further evened out in the second series of tests for an embodiment of the present invention. This is shown in FIG. 12. The gas mass flows were increased by approximately 6% in the mid-section, as compared to the setting on which the layer thickness profile according to FIG. 10f is based.

In another series of tests to demonstrate the impact of the settings of the section parameters, such as size of the gas permeable surface and gas material flows, on the layer thickness uniformity with optimal pulse interval $t_{eff}$, the flow conditions in the reaction chamber were varied by means of the gas nozzle.

FIG. 13 shows the impact of the flow conditions in the reaction chamber on the layer thickness profile for an embodiment of the present invention, in which the pulse interval amounted to 10 msec each time. The flow conditions were varied by opening and closing the different sections. The symbols indicate which section was opened during the coating process. The other sections were closed during this series of tests.

As shown, a uniform layer can be achieved if the layer thickness curve of the opened outer section is superimposed on that of the mid-section.

Figure 14A:
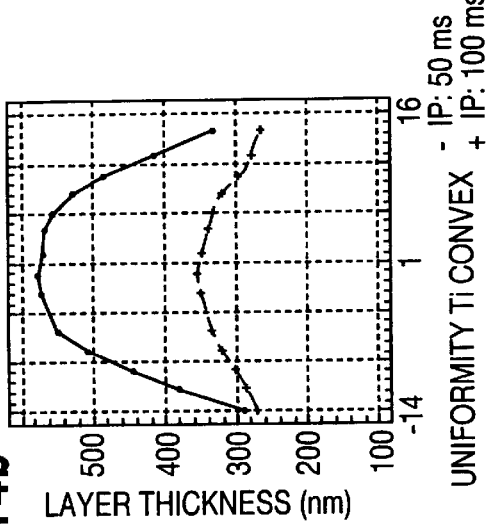
FIGS. 14a, 14b, 14c, and 14d depict layer thickness profiles of a $TiO_2$ layer for varying pulse intervals and section parameters in accordance with an embodiment of the present invention.
Figure 14B:
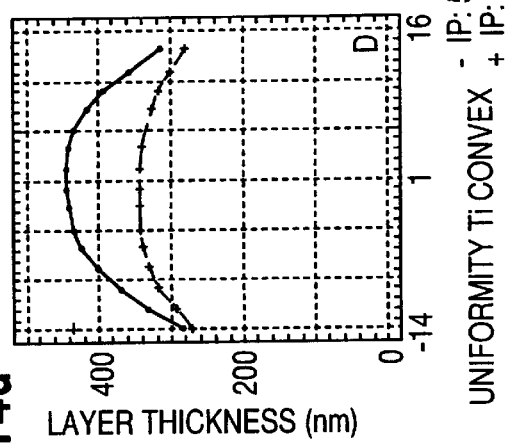
Figure 14C:
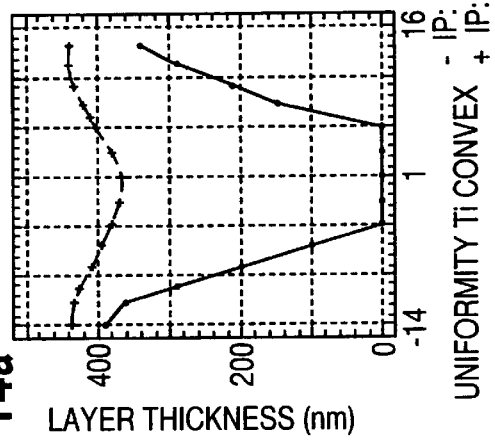
Figure 14D:
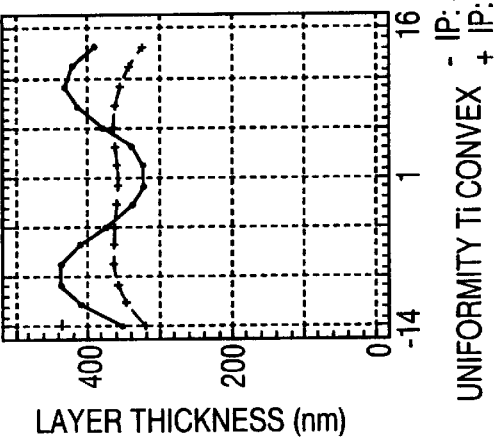
Figure 15:
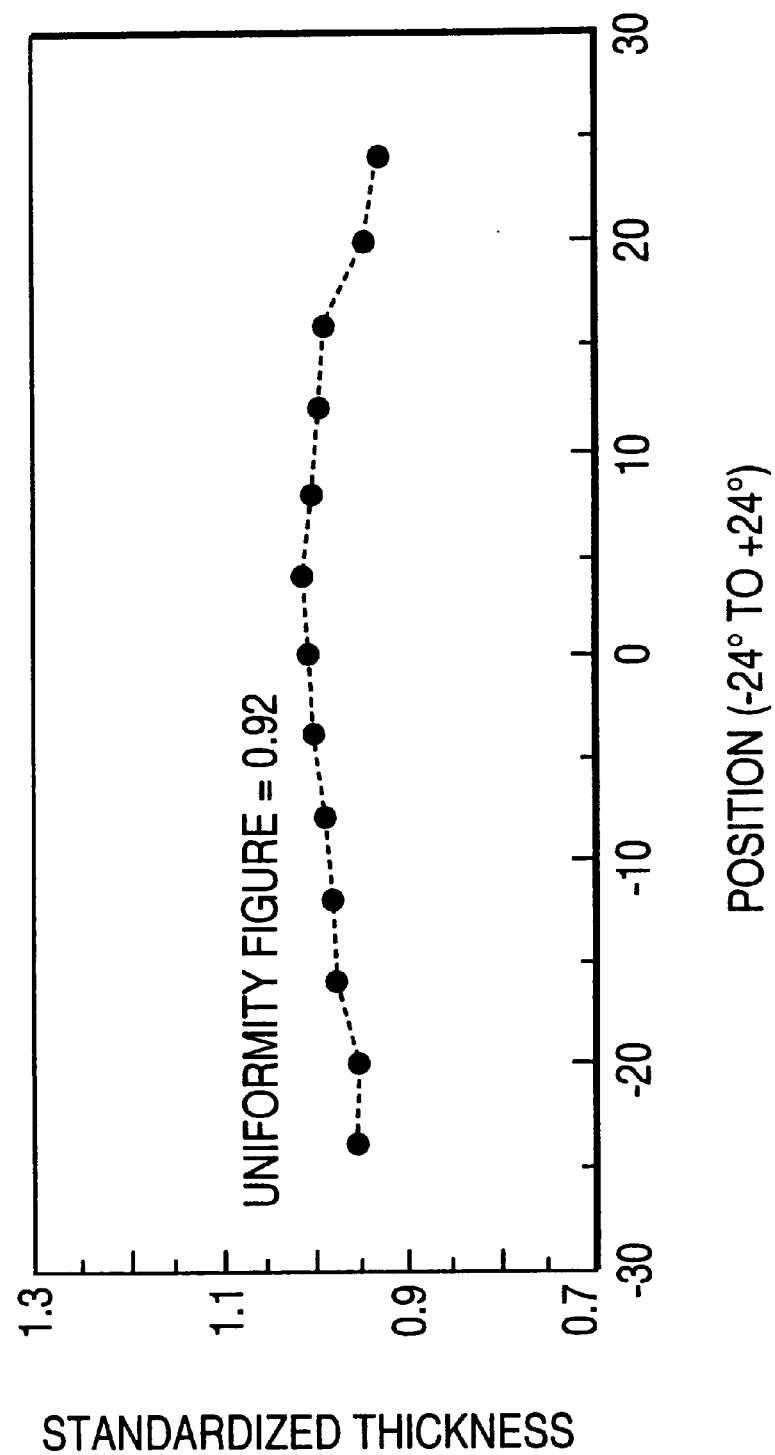
FIG. 15 depicts the layer thickness profile of an $SiO_2$ layer on a concave substrate at the end of a second series of tests for an embodiment of the present invention.

FIGS. 14a–14d show the impact of the gas section adjustment on the layer thickness profile for an embodiment of the present invention, in which two pulse intervals have been set. Here it involves a coating of $TiO_2$. In FIG. 14a all of the sections are closed except for the outer annular section. In the experiments in FIG. 14b, only the center section is open; in FIG. 14c, only the mid-section is open; and in FIG. 14d, all of the sections are open. Whereas with a non-optimal pulse interval of 50 ms a uniform layer can be produced only with difficulty, at a value of 100 ms a uniform layer thickness curve can be set by superimposing the layer thickness curves from FIG. 14a and FIG. 14b. Thus, a uniformity figure of 0.992 can be achieved when the outer section is completely opened, the mid-section is closed and 7.5% of the center section is opened.

Embodiments of the present invention have now been described in fulfillment of the above objects. It will be appreciated that these examples are merely illustrative of the invention. Many variations and modifications will be apparent to those skilled in the art.

We claim:

1. A process for determining parameters for a plasma impulse chemical vapor deposition (PICVD) process for manufacturing a coating of a predetermined thickness and uniformity on a curved substrate, the substrate having a substrate surface, wherein the substrate surface to be coated is exposed to a gas emitting surface of a gas showerhead, the gas emitting surface having a variable cross-sectional size, comprising:

placing the curved substrate in a reaction chamber;

streaming a gas mixture containing a coating gas into the reaction chamber, the streamed gas mixture having a gas mass flow;

generating separated plasma impulses separated by timed impulse pauses, the impulse pauses each having a time length and the plasma impulses each producing a coating thickness profile;

varying the time length of the impulse pauses in a first experimental run while keeping the size of the gas emitting surface and the gas mass flow constant, the time length varied until the coating thickness profile is optimized for uniformity;

while using the optimized length of time varying the size of the gas emitting surface and the gas mass flow in subsequent experimental runs, further optimizing the coating thickness profile for uniformity; and applying the optimized impulse pause time, gas emitting surface size, and gas mass flow parameters in manufacturing runs for the manufacture of coatings for the curved substrate.

2. The process according to claim 1, wherein the gas showerhead comprises a central circular zone, a medium ring zone, and an outer ring zone.

3. The process according to claim 1, wherein the curved substrate is a lens.

4. The process according to claim 1, wherein the gas showerhead has an edge, wherein only a portion of residual gas mixture remaining in the reaction chamber after an impulse is removed by a pump located at the edge of the gas showerhead.

5. The process according to claim 4, wherein the residual gas mixture is pumped in a rotationally symmetrical manner relative to the substrate.

6. The process according to claim 1, wherein the plasma impulses are generated using a microwave plasma impulse chemical vapor deposition (PICVD) process.

7. The process according to claim 1, wherein the curved substrate is a lens comprised of a material selected from the group consisting of glass and plastic.

8. The process according to claim 1, wherein the substrate surface comprises at least two surfaces, the at least two surfaces including a first surface and a second surface, and wherein the first and second surfaces of the substrate are coated consecutively.

9. The process according to claim 1, wherein the gas showerhead comprises a plurality of separate showerhead zones, wherein the substrate surface comprises at least two surfaces, wherein the two surfaces of the substrate are coated simultaneously, and wherein each of the at least two surfaces is exposed to opposing gas showerhead zones.

10. The process according to claim 9, wherein the gas mixture is supplied to the reaction chamber on a continuous basis.

11. A process for determining parameters for a plasma impulse chemical vapor deposition (PICVD) process for manufacturing a coating of a predetermined thickness on a curved substrate, the substrate having a substrate surface, wherein the substrate surface to be coated is exposed to a gas emitting surface of a gas showerhead, the gas emitting surface having a variable cross-sectional size, comprising:

streaming a gas mixture containing a coating gas into the reaction chamber, the streamed gas mixture having a gas mass flow;

generating separated plasma impulses separated by timed impulse pauses, the impulse pauses each having a time length and the plasma impulses each producing a coating thickness profile;

wherein the time length of the impulse pauses for the substrate in a first experimental run is changed gradually from an initial value to a final value while keeping the size of the gas emitting surface and the gas mass flow constant, such that at the final value the coating thickness profile on the substrate does not show further averaging.

12. The process according to claim 11, wherein the gas emitting surface and gas mass flow is varied in a subsequent experimental run while the time length of the impulse pauses remains constant at the final value until the thickness profile is constant.

13. A process for determining parameters for a plasma impulse chemical vapor deposition (PICVD) process for manufacturing a coating of a predetermined thickness and uniformity on a curved substrate, the substrate having a substrate surface, wherein the substrate surface is exposed to a gas emitting surface of a gas showerhead, the gas emitting surface having a variable cross-sectional size, comprising:

placing the curved substrate in a reaction chamber;

streaming a gas mixture containing a coating gas into the reaction chamber, the streamed gas mixture having a gas mass flow;

generating separated plasma impulses separated by timed impulse pauses, the impulse pauses each having a time length and the plasma impulses each producing a coating thickness profile;

identifying a time length for the impulse pauses that allows residual gas from a previous plasma impulse to be cleared from the reaction chamber before activation of a succeeding plasma impulse;

maintaining the cross-sectional size of the gas emitting surface and the gas mass flow as the time length of the impulse pauses is gradually varied;

varying the impulse pause time length in a first experimental run in an experimental range from an initial value to an intermediate value, the intermediate value being shorter than the time length required for the residual gas to clear the reaction chamber;

further varying the intermediate value to a final value in the experimental range, the final value optimizing the coating thickness profile for uniformity on the curved substrate; and applying the final value parameter in manufacturing runs for the manufacture of coatings of the predetermined thickness and uniformity.

14. The process according to claim 13, wherein the gas emitting surface and gas mass flow is varied in a subsequent experimental run while the time length of the impulse pauses remains constant at the final value until uniformity of the thickness profile is achieved.

15. The process according to claim 13, wherein the gas showerhead comprises a central circular zone, a medium ring zone, and an outer ring zone.

16. The process according to claim 13, wherein an impulse pause of >500 msec is set as the initial value.

17. The process according to claim 13, wherein the gas showerhead has an edge, wherein only a portion of residual gas mixture remaining in the reaction chamber after an impulse is removed by a pump located at the edge of the gas showerhead.

18. The process according to claim 17, wherein the residual gas mixture is pumped in a rotationally symmetrical manner relative to the substrate.

19. The process according to claim 13, wherein the substrate surface comprises at least two surfaces, the at least two surfaces including a first surface and a second surface, and wherein the first and second surfaces of the substrate are coated consecutively.

20. The process according to claim 13, wherein the gas showerhead comprises a plurality of separate showerhead zones, wherein the substrate surface comprises at least two surfaces, wherein the two surfaces of the substrate are coated simultaneously, and wherein each of the at least two surfaces is exposed to opposing gas showerhead zones.

* * * * *